United States Patent
Hammerschmidt

(10) Patent No.: US 7,161,480 B2
(45) Date of Patent: Jan. 9, 2007

(54) IN-OPERATION TEST OF A SIGNAL PATH

(75) Inventor: Dirk Hammerschmidt, Villach (AT)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 10/916,950

(22) Filed: Aug. 12, 2004

(65) Prior Publication Data
US 2005/0038623 A1    Feb. 17, 2005

(30) Foreign Application Priority Data
Aug. 12, 2003   (DE) ................. 103 37 045

(51) Int. Cl.
*G08B 29/00* (2006.01)
*G01R 27/28* (2006.01)

(52) U.S. Cl. ..................... 340/514; 702/117
(58) Field of Classification Search ............... 340/514
See application file for complete search history.

(56) References Cited

U.S. PATENT DOCUMENTS

| | | | | |
|---|---|---|---|---|
| 4,962,368 A | * | 10/1990 | Dobrzanski et al. | 340/514 |
| 5,513,878 A | * | 5/1996 | Ueda et al. | 280/735 |
| 6,252,503 B1 | | 6/2001 | Berger et al. | 340/514 |
| 7,006,445 B1 | * | 2/2006 | Cole et al. | 370/247 |

FOREIGN PATENT DOCUMENTS

| | | |
|---|---|---|
| DE | 101 22 868 A1 | 11/2002 |
| DE | 101 41 855 C1 | 4/2003 |

* cited by examiner

Primary Examiner—Donnie L. Crosland
(74) Attorney, Agent, or Firm—Baker Botts, L.L.P.

(57) ABSTRACT

A device for generating a sensor signal suitable for an in-operation test of a signal path from a sensor cell to an evaluation location. The sensor cell provides a sensor cell output signal depending on a physical magnitude to be detected which is changed in a changer for changing the sensor cell output signal according to a predetermined change regulation based on a test signal in order to obtain the sensor signal. A signal derived from the sensor signal is detected by a device for an in-operation test of the signal path and is evaluated.

13 Claims, 7 Drawing Sheets

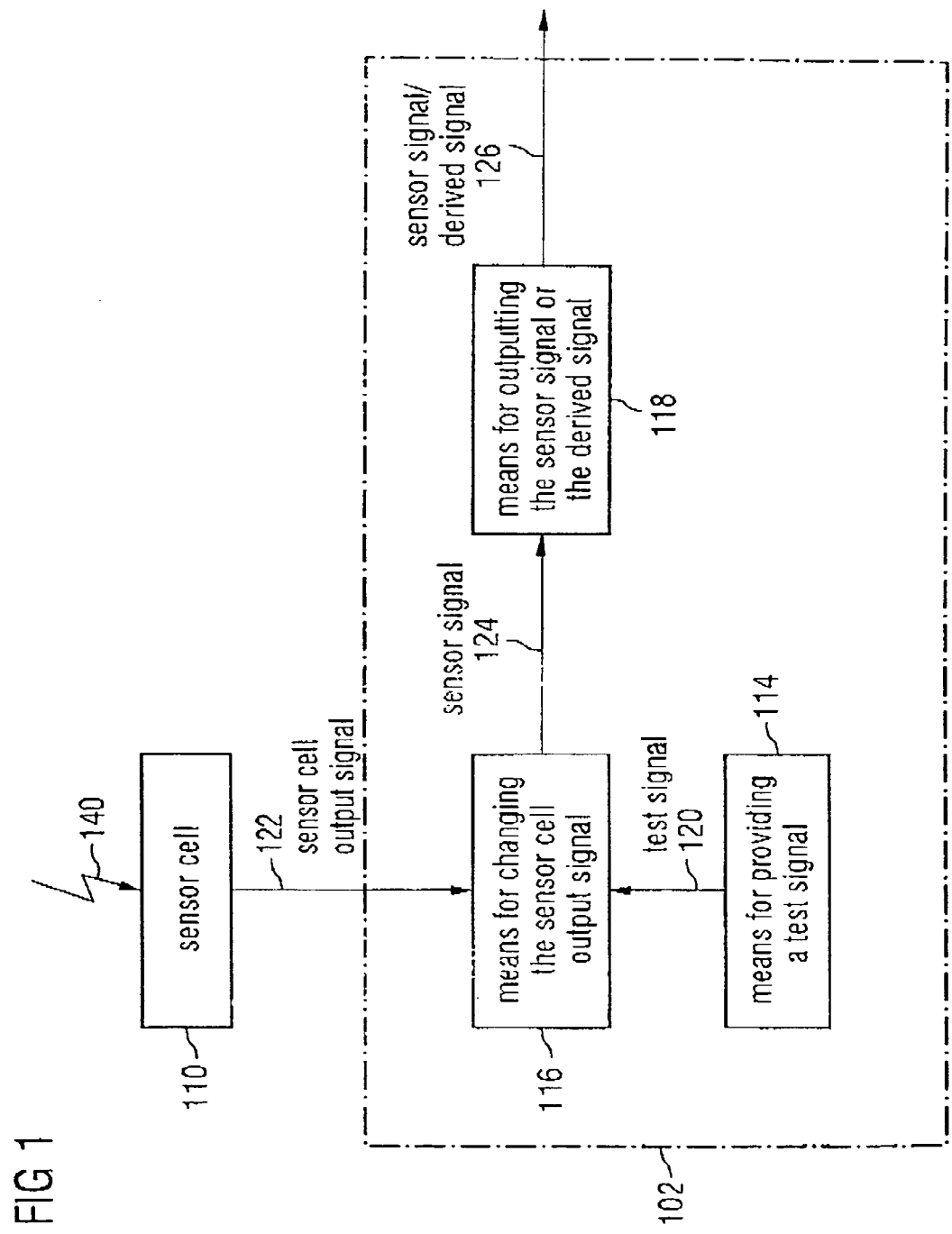

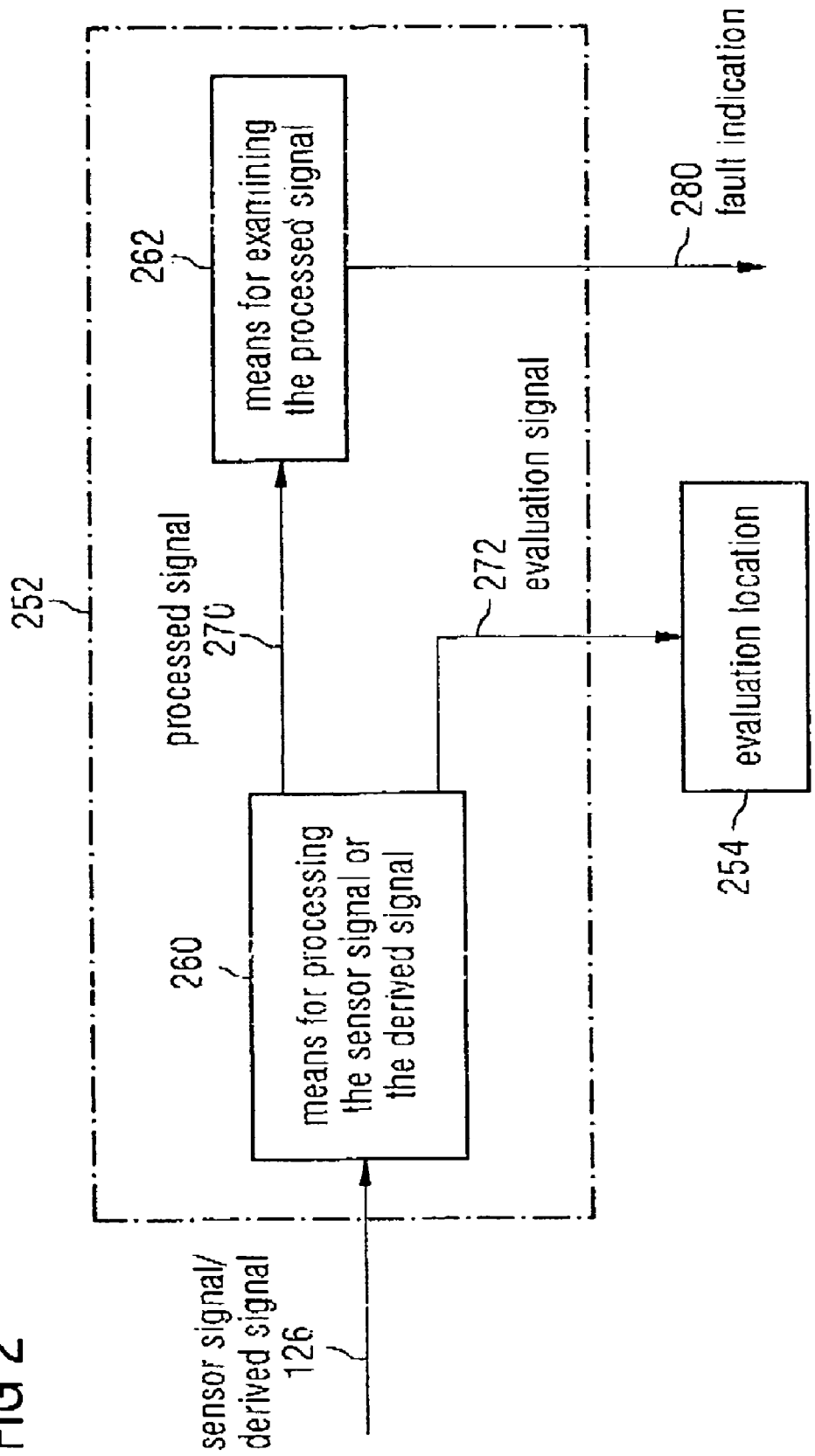

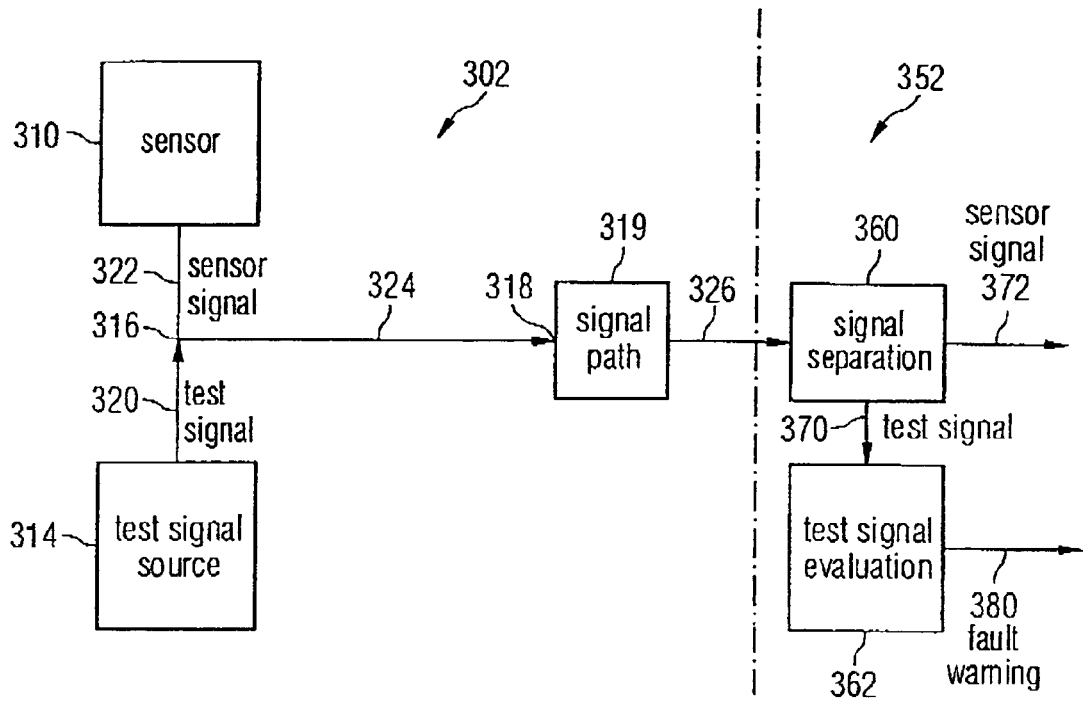
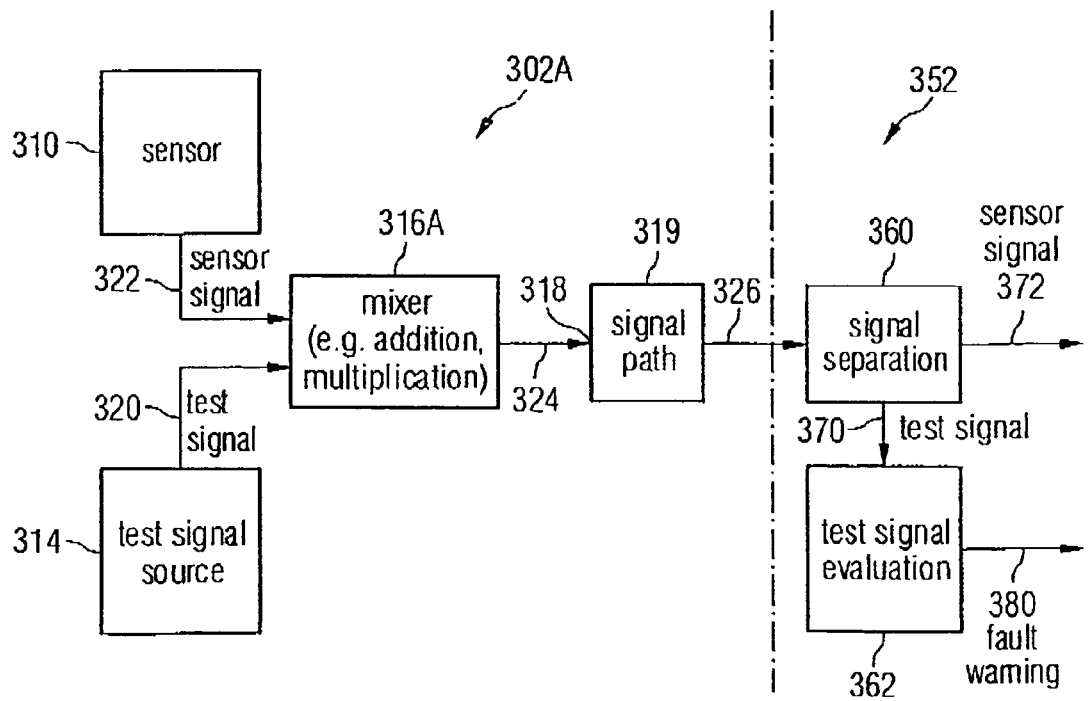

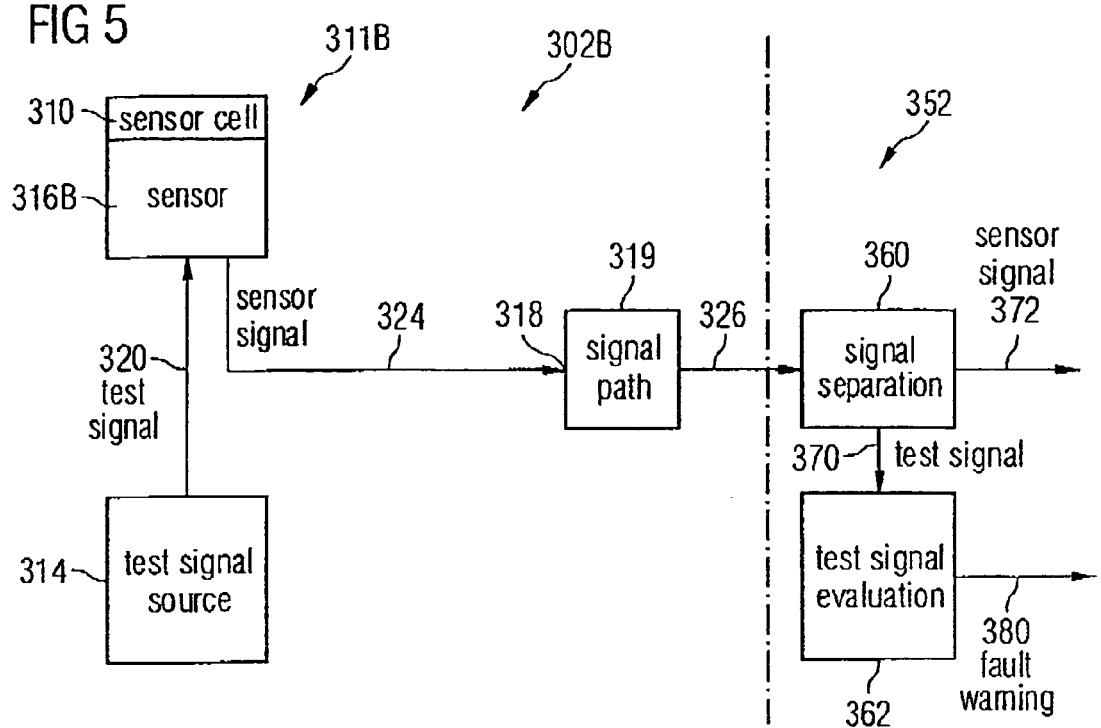
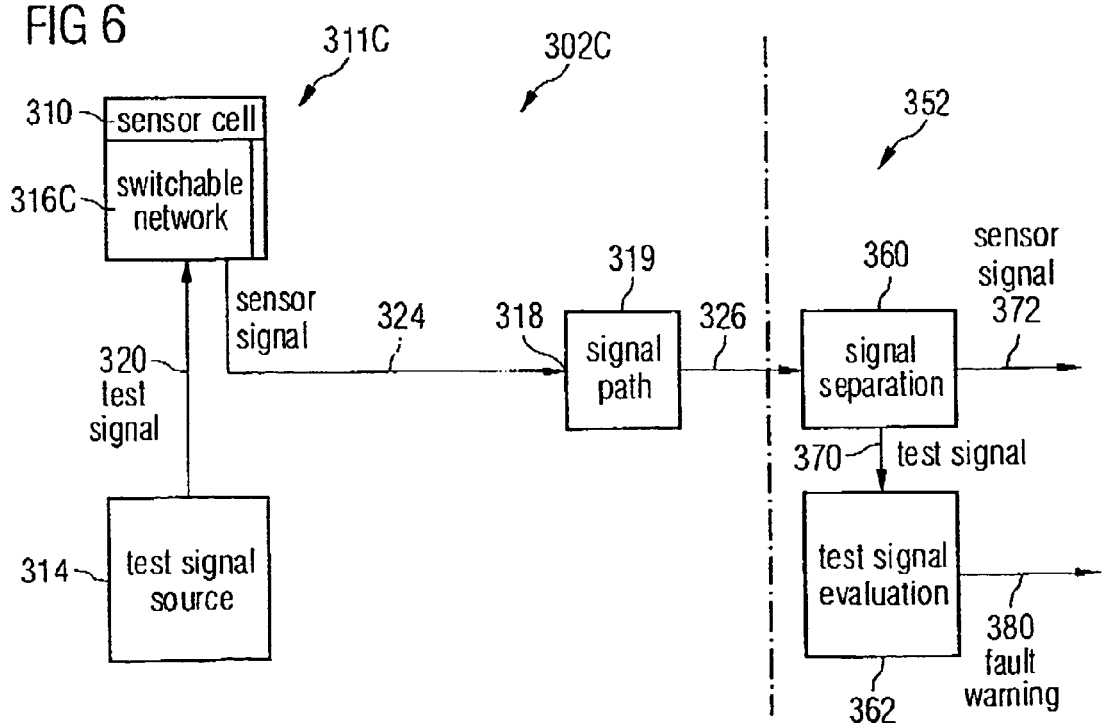

IN-OPERATION TEST OF A SIGNAL PATH

PRIORITY

This application claims priority to German application no. 103 37 045.5 filed Aug. 12, 2003.

TECHNICAL FIELD OF THE INVENTION

The invention relates to an in-operation test of a signal path, and in particular to the in-operation test of a signal path between a sensor cell and an evaluation location.

DESCRIPTION OF THE RELATED ART

Sensors use the change of electronic parameters of a device (sensor cell) by an external influence (measured quantity). For example, in a capacitive pressure sensor the capacity of a capacitor changes when its membrane bends as a consequence of an increasing pressure. A measurement circuit consequently measures the change of the electric parameters of a sensor cell and converts the same into an output voltage or a digital. The output voltage or the digital value is subsequently transmitted via a signal path to an evaluation circuit and evaluated by the same.

Sensor devices, like pressure or temperature sensors having an associated evaluation electronic, are frequently employed in security-relevant applications. In order to examine the functioning of the sensor device, regular function tests and preferably self-tests of the sensor device are performed. Usually, self-tests of sensor devices are performed offline. This means that during the time in which the self-test is performed the sensor device is not operational. Such diagnostic methods are for example realized in the Infineon side airbag sensor KP 100. In particular in such security-relevant applications is it disadvantageous if the sensor device is not operational during the self-test.

In the dissertation of Dirk Weiler "Selbsttest und Fehlertoleranz mit zugelassener milder Degradation in integrierten CMOS-Sensorsystemen" at the Gerhard-Mercator-Universitat Duisburg of 7 Jun. 2001 and the publication of D. Weiler, O. Machul, D. Hammerschmidt, B. J. Hosticka "Detection of Defective Sensor Elements Using SD-Modulation and a Matched Filter" Proceeding of the Design, Automation and Test in Europe Conference (Date 2000), 27 Mar.–30 Mar. 2000, Paris, France, pp. 599–603, IEEE Computer Society Washington, Brussels, Tokyo, March 2000, alternative self-test methods for temperature sensors and pressure sensors in a special combination of sigma-delta modulators and matched filters are described. These methods use an excitement of the sensors by a temperature increase using a heating element or an electrostatic deflection of a capacitive pressure sensor in order to generate testable signal changes. This offers the advantage of also testing the sensor, is, however, due to the generally high current consumption for obtaining the heating power or due to the enormous voltages for a deflection of a membrane by electrostatics often not acceptable. In addition, in this method due to the low signal energy very large observation periods are required until an error is reliably diagnosed. In addition, for a suppression of parasitic signal paths which couple the energy-rich simulation signal in behind a possible defect into the signal path and thus prevent the recognition of the error, is very cost and time consuming. Parasitic signal paths in temperature sensors are for example the temperature dependency of the circuit of the signal path versus a heating up of the circuit IC by the heating element or a crosstalk between the current lines, the heat power drivers and the heating elements on the one hand and the nodes of the sensor signal processing circuit on the other hand. In an electrostatic deflection of MEM capacitors with high excitation voltages parasitic signal paths may occur by a crosstalk across a substrate or operation voltage lines. A further disadvantage of these methods is that during the self-test the measurement value of the sensor is corrupted. Thus, these methods do also not allow a reliable operation of the sensor device during the self-test.

SUMMARY OF THE INVENTION

It is the object of the present invention to provide a device and a method for an in-operation test of a signal path of a sensor device providing a reliable test result and enabling an uninterrupted operation of the sensor device during the test.

In accordance with a first aspect, the present invention provides a device for generating a sensor signal suitable for an in-operation test of a signal path from a sensor cell to an evaluation location, wherein the sensor cell provides a sensor cell output signal depending on a physical magnitude to be detected, having means for providing a test signal; means for changing the sensor cell output signal based on the test signal according to a predetermined change regulation in order to obtain the sensor signal so that the sensor signal depends on the sensor cell output signal and the test signal; and means for outputting the sensor signal or a signal derived from the sensor signal on the signal path.

In accordance with a second aspect, the present invention provides a device for an in-operation test of a signal path from a sensor cell to an evaluation location, wherein the sensor cell provides a sensor cell output signal depending on a physical magnitude to be detected, wherein the sensor cell output signal is changed based on a test signal according to a predetermined change regulation in order to form a sensor signal, wherein the sensor signal or a signal derived from the sensor signal may be transmitted via a signal path, having means for processing the sensor signal or the signal derived from the sensor signal considering the predetermined change regulation in order to obtain a processed signal; and means for examining the processed signal with regard to a presence or an absence of the test signal in order to provide a fault indication in case of an absence of the test signal.

In accordance with a third aspect, the present invention provides a method for generating a sensor signal suitable for an in-operation test of a signal path from a sensor cell to an evaluation location, wherein the sensor cell provides a sensor cell output signal depending on the physical magnitude to be detected, with the steps of (a) providing a test signal; (b) changing the sensor cell output signal based on the test signal according to a predetermined change regulation in order to obtain the sensor signal so that the sensor signal depends on the sensor cell output signal and the test signal; and (c) outputting the sensor signal or a signal derived from the sensor signal onto the signal path.

In accordance with a fourth aspect, the present invention provides a method for an in-operation test of a signal path from one sensor cell to an evaluation location, wherein the sensor cell provides a sensor cell output signal depending on a physical magnitude to be detected, wherein the sensor cell output signal is changed based on a test signal according to a predetermined change regulation in order to form a sensor signal, wherein the sensor signal or a signal derived from the sensor signal may be transmitted via a signal path, with the steps of (a) processing the sensor signal or the signal derived from the sensor signal considering the predetermined change regulation in order to obtain a processed signal; and (b) examining the processed signal with regard to a presence or absence of the test signal in order to provide a fault indication in case of an absence of the test signal.

In accordance with a fifth aspect, the present invention provides a computer program having a program code for performing the method for generating a sensor signal suitable for an in-operation test of a signal path from a sensor cell to an evaluation location, wherein the sensor cell provides a sensor cell output signal depending on the physical magnitude to be detected, comprising the steps of (a) providing a test signal; (b) changing the sensor cell output signal based on the test signal according to a predetermined change regulation in order to obtain the sensor signal so that the sensor signal depends on the sensor cell output signal and the test signal; and (c) outputting the sensor signal or a signal derived from the sensor signal onto the signal path, when the computer program runs on a computer.

In accordance with a sixth aspect, the present invention provides a computer program having a program code for performing the method for an in-operation test of a signal path from one sensor cell to an evaluation location, wherein the sensor cell provides a sensor cell output signal depending on a physical magnitude to be detected, wherein the sensor cell output signal is changed based on a test signal according to a predetermined change regulation in order to form a sensor signal, wherein the sensor signal or a signal derived from the sensor signal may be transmitted via a signal path, with the steps of (a) processing the sensor signal or the signal derived from the sensor signal considering the predetermined change regulation in order to obtain a processed signal; and (b) examining the processed signal with regard to a presence or absence of the test signal in order to provide a fault indication in case of an absence of the test signal, when the computer program runs on a computer.

The invention is based on the finding that a measurement information generated by a Sensor cell may be overlaid with test information. The overlaid information is transmitted together to an evaluation electronics. An evaluation of the thus generated sensor signal in the evaluation electronics is consulted in order to test the functioning of a signal chain between the sensor cell and the evaluation electronics and to signalize in case of a failure that the signals of a sensor device are no longer trusted.

According to the present invention, the sensor device comprises a sensor means and an evaluation means. The sensor means is connected to the evaluation means via a signal path.

The sensor means comprises a sensor cell that provides a Sensor cell output signal depending on a physical magnitude to be detected. According to a predetermined change regulation the sensor cell output signal is changed based on a provided test signal. The thus generated sensor signal contains both measurement information about the physical magnitude detected by the sensor cell and test information from the test signal. The sensor signal is transmitted via the signal path to the evaluation means and is received by the same.

The evaluation device separates the measurement information contained within the transmitted sensor signal from the test information based on the processing regulation. The recovered test information enables a test of the complete signal path from the sensor cell to the evaluation location. The recovered measurement information is further processed independent of the test information.

The particular advantage of the present invention is that it enables subjecting the overall signal path from a sensor cell to an evaluation location to a continuous self-test without interrupting the measurement or corrupting the measurement value of the sensor.

As no physical effect is used to generate the test signal, the usability of the inventive test method is not restricted to special cases in which the physical effects may be caused by electric stimulation. In addition, no high powers as for the thermal stimulation of a sensor or high voltages as for the electrostatic generation of forces are required. A crosstalk of test signals from an input to an output of the test chain, as may be caused by energy-rich signals for an electric stimulation of a sensor with a low sensitivity for stimulation (e.g. thermal or electrostatic), is far less probable in a stimulation with small electric signals which are not attenuated by the measurement effect or a parasitic effect of the sensor, like for example a temperature-dependent tension or an electrostatic deflection of a pressure sensor membrane, and may be suppressed using little effort.

According to a further preferred embodiment, the evaluation means is additionally connected to the test signal. This enables a further protection and a fault localization of the self-test. The presence of the test signal is checked and the test signal is used for a comparison to the test information recovered from the sensor signal.

BRIEF DESCRIPTION OF THE DRAWINGS

These and other objects and features of the present invention will become clear from the following description taken in conjunction with the accompanying drawings, in which:

FIG. 1 shows a block diagram of a device for generating a sensor signal according to the present invention;

FIG. 2 shows a block diagram of a device for in-operation testing of a signal path according to the present invention;

FIGS. 3 to 6 show block diagrams of the preferred embodiments of sensor devices comprising a device for generating a sensor signal and a device for in-operation testing of a signal path according to the present invention.

DESCRIPTION OF THE PREFERRED EMBODIMENTS

Figure 9A:
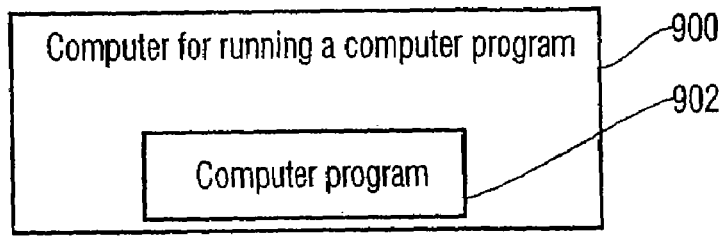
FIGS. 9a, 9b, and 9c show a computer for running a computer program and flow charts of the steps performed by the computer program performing methods according to various embodiments of the present invention.

In FIG. 1 a sensor means is shown, comprising a device 102 for generating a sensor signal for an in-operation test of a signal path from a sensor cell 110 to an evaluation location (shown in FIG. 2). The device 102 for generating a sensor signal comprises means 114 for providing (Step 1a in FIG. 9a) a test signal, means 116 for changing (Step 2a in FIG. 9a) the sensor cell output signal and means 118 for outputting (Step 3a in FIG. 9a) the sensor signal or the derived signal. Means 114 for providing a test signal is implemented for providing a test signal 120. Means 116 for changing the sensor cell output signal is coupled to means 114 via the test signal 120 for providing a test signal and to the sensor cell via a sensor cell output signal 122 provided by the sensor cell 110. Means 116 for changing the sensor cell output signal is implemented in order to provide a sensor signal 124 according to a predetermined change regulation in response to the sensor cell output signal 122 and the test signal 120. The sensor signal 124 contains both measurement information from the sensor cell output signal 122 and test information from the test signal. Means 118 for outputting the sensor signal or the derived signal provides a sensor signal in response to the sensor signal 124 or a signal derived from the sensor signal, in the following only referred to as the derived signal 126. Via the derived signal 126 the sensor means shown in FIG. 1 is connected to an evaluation means shown in FIG. 2.

The sensor cell 110 is implemented to detect a physical magnitude 140. In this embodiment, the physical magnitude 140 to be detected is a pressure to be detected and the sensor cell 110 is a pressure sensor implemented in the form of a capacitive pressure sensor. A capacitive pressure sensor comprises a capacitor and a membrane. As a result of the increasing or decreasing pressure on the membrane, the capacity of the capacitor changes. The capacity change depends on the pressure to be detected and is detected by the sensor cell output signal 122. Thus, the sensor cell output signal 122 contains measurement information about the physical magnitude 140 to be detected. According to the present invention, in addition to the measurement information a test information is transmitted to the evaluation means shown in FIG. 2.

The test information is provided from means 114 for providing a test signal such that the test information together with the information about the detected physical magnitude 140 may be transmitted to the evaluation means without influencing the measurement information via the detected physical magnitude. A combination of the sensor cell output signal 122 containing the measurement information with the test signal 120 containing the test information takes place in means 116 for changing the sensor cell output signal according to a predetermined change regulation. Possible forms of the change regulation are shown in the following embodiments. Means 116 for changing the sensor cell output signal provides the sensor signal 124 uniting the measurement information and the test information. Preferably, the test signal comprises a frequency range which is as far as possible away from the sensor cell output signal 122. In this case, the information of the sensor cell output signal 122 and the test signal 120 are transmitted in an FDMA method via the sensor signal 124. Alternatively, the sensor signal 124, if its band width is high enough, may be used in the time multiplex (TDMA) or in the code multiplex (CDMA).

In order to pass on the sensor signal 124 to the evaluation means, the device 102 for generating a sensor signal comprises means 118 for outputting the sensor signal or the derived signal. Means 118 for outputting the sensor signal or the derived signal may be a through line or a driver. In this case, the derived signal 126 corresponds to the sensor signal 124. Alternatively, means 118 for outputting the sensor signal or the derived signal may also be a sampling means, like an analogue-digital converter, a multiplex means or any other transmission means which enables transmitting the sensor signal 124 to the evaluation means shown in FIG. 2.

Figure 9B:
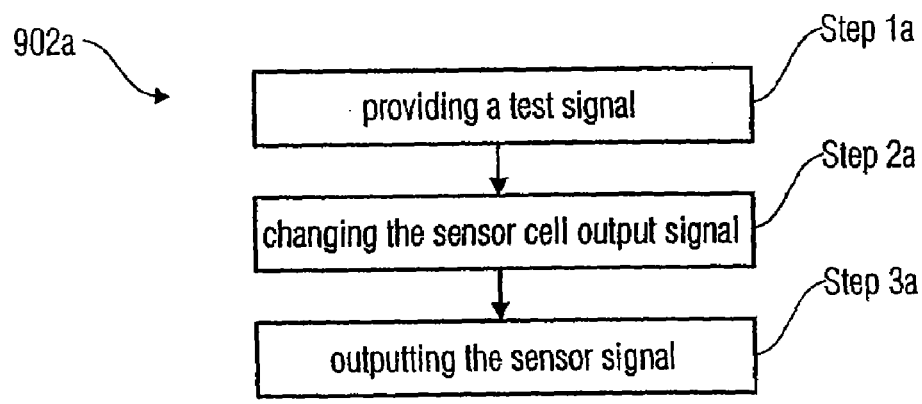
Figure 9C:
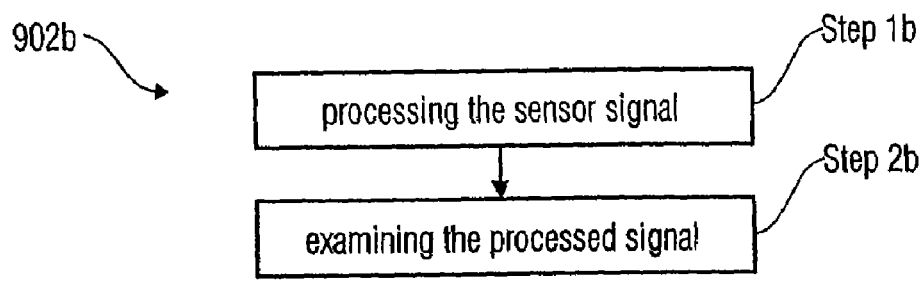

In FIG. 2 an evaluation means is shown comprising a device 252 for an in-operation test of a signal path from a sensor cell (shown in FIG. 1) to an evaluation location 254. The device 252 for in-operation testing of a signal path comprises means 260 for processing (Step 1*b* in FIG. 9*b*) the sensor signal or the derived signal and means 262 for examining the processed signal. Means 260 for processing the sensor signal or the derived signal is connected to the derived signal 126. Means 260 for processing the sensor signal or the derived signal thus produces a connection to the sensor means shown in FIG. 1. In response to the derived signal 126 means 260 for processing the sensor signal or the derived signal provides a processed signal 270 which is in this embodiment connected to the evaluation location 254 and means 262 for examining (Step 2*b* in FIG. 9*b*) the processed signal. Means 262 for examining the processed signal is implemented to provide a fault indication 280.

Means 260 for processing the sensor signal or the derived signal is implemented to detect the derived signal 126. As it is described in FIG. 1, the derived signal 126 contains both measurement information and test information. Means 260 for processing the sensor signal or the derived signal is implemented to separate the measurement information from the test information 120 considering the change regulation predetermined by means 160 for changing the sensor cell output signal shown in FIG. 1. The measurement information is passed on from means 260 for processing the sensor signal or the derived signal via the evaluation signal 272 to the evaluation location 254. The recovered test information about the test signal is passed on from means 206 for processing the sensor signal or the derived signal via the processed signal 270 to means 260 for examining the processed signal. Means 262 for examining the processed signal is implemented to examine the processed signal 270 with regard to a presence or absence of the test information of the test signal and to provide a fault indication 280 in case of an absence.

The fault indication 280 gives an indication about the reliability of the signal path from the sensor cell to the evaluation location. If the test information was correctly transmitted via the signal path, then it may be assumed with high probability that also the measurement information was transmitted correctly. If the test information in means 262 for examining the processed signal is not verified correctly, then it is signalized that the evaluation signal 272 is possibly not reliable.

Means 260 for processing the sensor signal or the derived signal is implemented in order to provide a processed signal 270 and an evaluation signal 272 in response to the derived signal 126.

FIGS. 3–6 show different embodiments of a sensor means connected to an evaluation means. The sensor means respectively comprises one device for generating a sensor signal and the evaluation means comprises a device for an in-operation test of a signal path.

A device 302 shown in FIG. 3 for generating a sensor signal comprises a sensor cell 310 in the form of a sensor, means 314 for providing a test signal in the form of a test signal source, means 316 for changing the sensor cell output signal and means 318 for outputting the sensor signal onto a signal path 319.

As described in FIG. 1, means 314 for providing a test signal provides a test signal 320 containing test signal information, and the sensor cell 310 provides a sensor cell output signal 322 containing information about a detected physical magnitude. In response to the test signal 320 and the sensor cell output signal 322, means 316 for changing the sensor cell output signal provides a sensor signal 324. In response to the sensor signal 324 means 318 for outputting the sensor signal provides the sensor signal on the signal path 319. In this embodiment, the signal path 319 comprises an amplifier chain or an analogue-digital converter (not shown) which provide a derived signal 326.

In this embodiment, the change regulation causes a feeding-in of the test signal 320 into the sensor cell output signal 322. The change is performed in means 316 for changing the sensor cell output signal. If the sensor cell 310 comprises a resistive measurement bridge, then the change is performed by feeding in the test signal 320 in the form of a switched current into the sensor cell output signal 322 in the form of the output line of the resistive measurement bridge. The switched current at the bridge resistors of the measurement bridge causes a change of the bridge output voltage. The holds true for a sensor cell 310 in the form of a Hall sensor cell comprising a Hall plate. The test signal 320 is defined via its current intensity in this embodiment. Means 316 for changing the sensor cell output signal is a node point of the sensor cell output signal 322 and the test signal 320.

The device 352 for an in-operation test of a signal path from a sensor cell to an evaluation location according to the embodiment shown in FIG. 2 comprises means 360 for processing the sensor signal of the signal derived from the sensor signal in the form of a signal separation means and means 362 for examining the processed signal in the form of a test signal evaluation means. Means 360 for processing the sensor signal is implemented in order to detect the derived sensor signal 326 and to provide a processed signal 370 and an evaluation signal 372 in response to the derived signal 326. The evaluation signal 372 contains information about the physical magnitude detected by the sensor cell 310 and passes on the same to an evaluation location (not shown in this and in the following figures). Means 362 for examining the processed signal 370 with regard to a presence or absence of information of the test signal is implemented in order to provide a fault warning 380 in case of an absence of information of the test signal 320.

The construction and the function of the device 352 shown in FIGS. 3–6 for in-operation testing of a signal path corresponds to a device for in-operation testing of a signal path of the embodiment shown in FIG. 2 and is not explained any further below.

FIG. 4 shows a further embodiment of a device 302a for generating a sensor signal. The embodiment shown in FIG. 4 is different from the embodiment shown in FIG. 3 with regard to the implementation of means 316a for changing the sensor cell output signal. All other elements are unchanged and comprise the same reference numerals as in FIG. 3. Means 316a for changing the sensor cell output signal is realized in this embodiment in the form of a mixer. Means 316a for changing the sensor cell output signal is implemented in order to add to or upward modulate the sensor output signal 322. This may be performed by an additive or multiplicative test signal input.

In FIG. 5, a further embodiment of a device 302b for generating a sensor signal is shown. The sensor cell 310 is integrated in a sensor circuit 312 in this embodiment which additionally comprises means for changing the sensor cell output signal 316b. The remaining elements shown correspond to those of FIGS. 3 and 4 and are therefore designated by the same reference numerals and are not explained any further in the following.

Means 316b for changing the sensor cell output signal comprises a sensor excitation voltage (not shown) and is implemented in order to provide the sensor signal 324 based on the Sensor excitation voltage in response to the sensor cell output signal (not shown) of the sensor cell 310. Means 316b for changing the sensor cell output signal is additionally implemented in order to perform a change of the Sensor excitation voltage based on the test signal 320. In this way, the sensor signal 324 depends both on the sensor cell output signal and on the test signal 320.

FIG. 6 shows a further embodiment of the device 302c for generating a sensor signal. In this embodiment, the sensor cell 310 is arranged in a sensor circuit 314 additionally comprising means 316c for changing the sensor cell output signal in the form of a switchable network. Any other shown elements that correspond to those in FIGS. 3–5 are designated by the same reference numerals and not explained any further in the following.

Means 316c for changing the sensor cell output signal is implemented in order to change a sensor configuration of the Sensor circuit 314 in response to the test signal 320. If the sensor circuit 314 comprises a capacitive or resistive measurement bridge in which the sensor cell 310 is arranged, then the change regulation of means 316c for changing the Sensor cell output signal may be a switching on or off of capacitors or resistors depending on the test signal 320. This way, the sensor cell output signal (not shown) containing information about a physical magnitude to be detected, is combined with test signal information and provided as a sensor signal 324.

Figure 7:
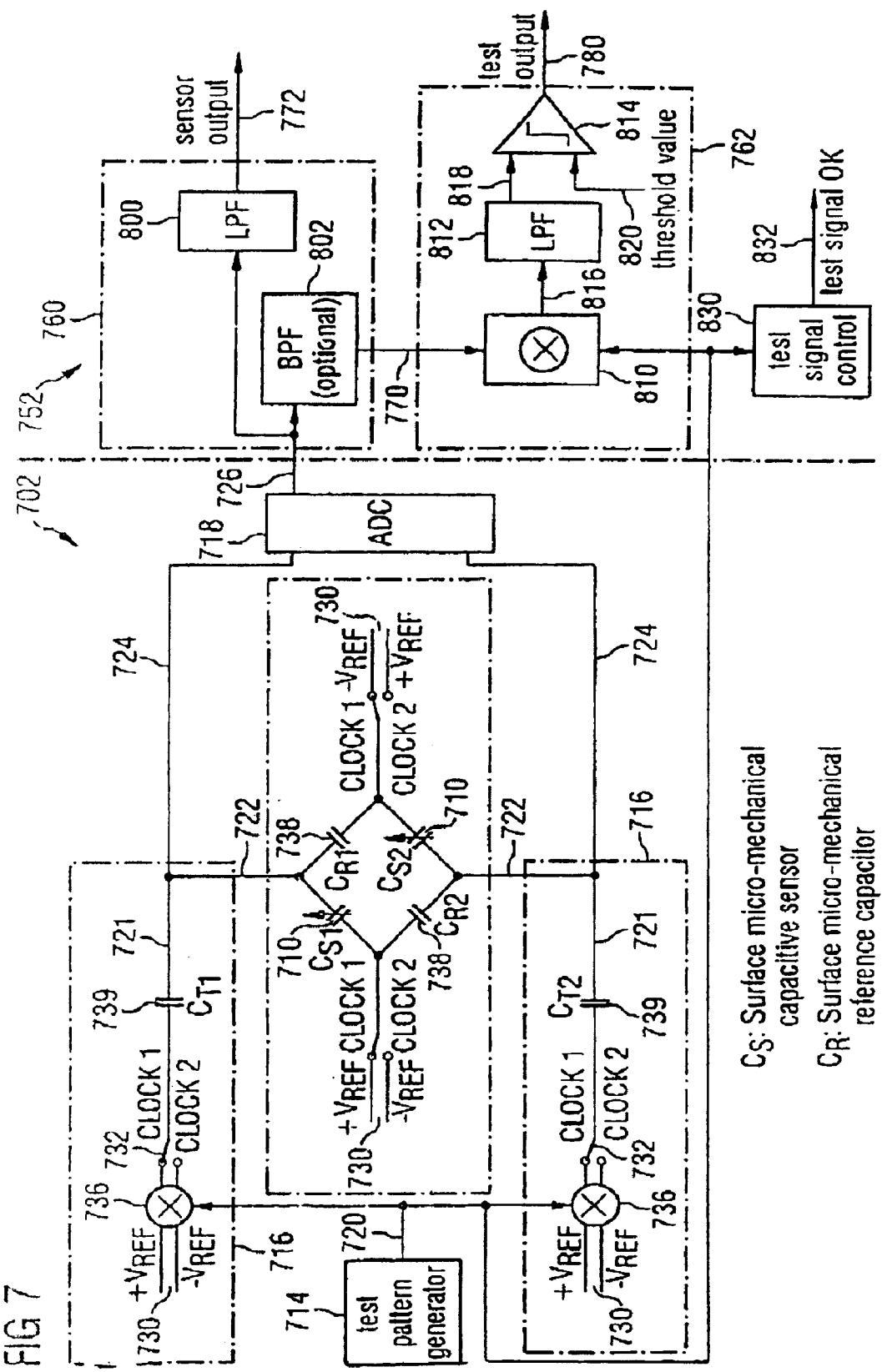
FIGS. 7 and 8 show block diagrams of sensor devices comprising a device for generating a sensor signal and a device for in-operation testing of a signal path connected to the test signal, according to further embodiments of the present invention.
Figure 8:
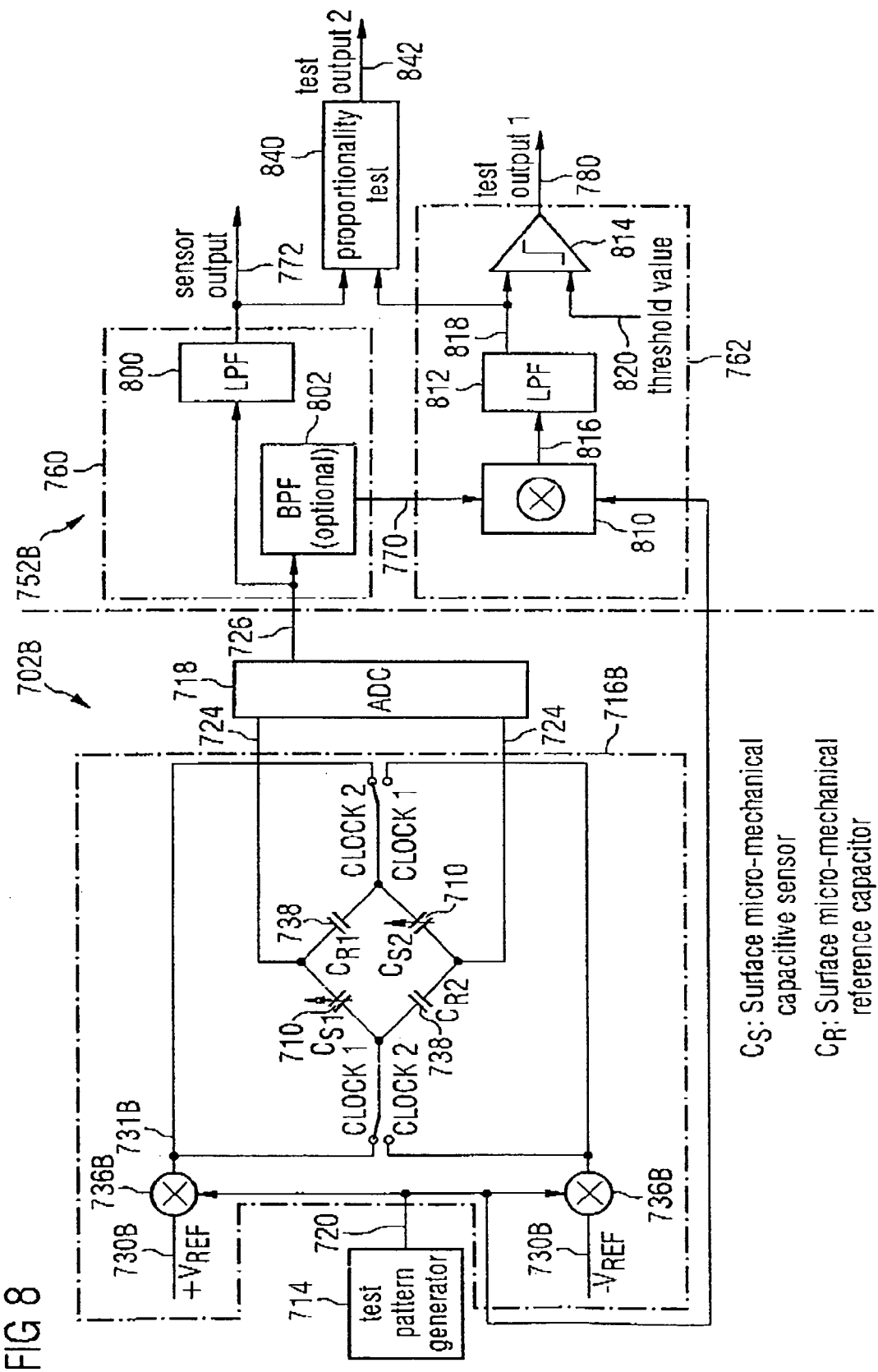

FIGS. 7–8 show further embodiments of a sensor means coupled to an evaluation means. The sensor means respectively comprises a device for generating a sensor signal and the evaluation means respectively comprises a device for in-operation testing of a signal path.

FIG. 7 shows a sensor means comprising a device 702 for generating a sensor signal and a plurality of sensor cells 710. The device 702 for generating a sensor signal comprises a sensor circuit 710c, means 714 for providing a test signal, two means 716 for changing the sensor cell output signal and means 718 for outputting the sensor signal. Means 714 for providing a test signal in the form of a test pattern generator is implemented to provide a test signal 720. The test signal 720 is connected to means 716 for changing the sensor cell output signal. In response to the test signal 720 means 716 for changing the sensor cell output signal provide an additive signal 721 and feed the same into the sensor cell output signal 722 of the sensor circuit 710 in order to obtain the sensor signal 724. The sensor signal 724 is connected to means 718 for outputting the sensor signal. Means 718 for outputting the sensor signal is implemented to provide the derived signal 726. In this embodiment, means 718 for outputting the sensor signal is an analogue-digital converter. The analogue-digital converter 718 represents a signal path which is monitored by the in-operation test.

In this embodiment, the sensor cells 710 are surface-mechanic capacitive sensors which are arranged in a capacitive pressure sensor measurement bridge together with surface-micromechanic reference capacitors 738. The measurement bridge comprises two sensor cells 710 and two reference capacitors 738 each. The measurement bridge is connected to a reference voltage 730 via clocked toggle switches 732 which are controlled by a first and a second clock. The switching over of the reference voltage 730 by the clock-controlled toggle switch 732 causes a clocked reload of the capacitive pressure sensor measurement bridge. Means 716 for changing the Sensor cell output signal also each comprise a reference voltage 730 and a clocked toggle switch 732. In addition, they each comprise a modulator 736 and a capacitor 739. The clocked toggle switches 732 generate an input voltage 730 by changing the polarity of the reference voltage. The changing of polarity is performed via the modulators 736 coupled to the reference voltage 730 and the test signal 720.

The control of the polarity-changing process is performed by the test signal 720 generated in means 714 for providing a test signal which is a test pattern generator in this embodiment. A capacitor 739 is connected to the toggle switch 732. The input voltage generated by the toggle switch 732 causes a reloading of the capacitor. As a consequence, the additive signal 721 comprises a test pattern depending on the test signal 720. The test pattern is preferably mean value free and has a frequency which is clearly above the sensor cell output signal frequencies. The additive signal 721 is fed in means 716 for changing the sensor cell output signal into the sensor cell output signal. The thus resulting sensor signal 724 is detected by means 718 for outputting the sensor signal. In this embodiment, means 718 for outputting the sensor signal is an analogue-digital converter generating the derived signal 726 from the sensor signal 724.

Alternative to the test pattern generator 714 the additive signal 721 may be directly generated with a voltage source sampled by the upstream switches 732 and the capacitors 739. Alternatively to the direct feeding-in of the additive signal 721 into the sensor cell output signal 722 the analogue-digital converter may also comprise an additional adding input into which the additive signal 721 is additively fed. In a further possible variant a summing amplifier is provided upstream from the analogue-digital converter into which the test signal is fed.

Alternatively to the capacitive measurement bridge, consisting of the surface-micromechanical capacitive Sensors 710 and the surface-mechanical reference capacitors 738 and alternatively to the capacitors 739 for generating the additive signal 721, equivalently also a resistive measurement bridge or a Hall probe in connection with resistors for generating the additive signal may be employed. In a resistive measurement bridge or Hall probe instead of the switchable measurement resistors also an additive signal may be generated by feeding a test stimulus as a current signal into the sensor cell output signal with the help of current sources.

FIG. 7 additionally shows an evaluation means which is coupled to the sensor means and a device 752 for in-operation testing. The device 752 for in-operation testing comprises means 760 for processing the sensor signal and means 762 for examining the processed signal. Means 760 for processing the sensor signal is connected to the derived signal 726. In response to the derived signal 726 means 760 for examining the processed signal provides a processed signal 770 and an evaluation signal 272. Means 762 for examining the processed signal is connected to the processed signal 770 and in this embodiment also to the test signal 720. In response to the processed signal 770 and the test signal 720 means 762 for examining the processed signal provides a fault indication 780.

Means 760 for processing the sensor signal or the derived signal comprises a low-pass filter 800 and a band-pass filter 802. Both the low-pass filter 800 and the band-pass filter 802 are connected to the derived signal 726. As the additive signal 721 containing the test information of the test signal 720 comprises a substantially higher frequency than the sensor cell output signal 722, using the low-pass filter 800 the information part of the test signal 720 at the derived signal 726 may be faded out. The resulting evaluation signal 772 contains the measurement information of the sensor cell output signals 722 at the derived signal 726. The evaluation signal 272 is passed on to an evaluation location (not shown in FIGS. 7 and 8). The test information part of the derived signal 726 is isolated with the band-pass filter 802 and passed on as a processed signal 770 to means 762 for examining the processed signal.

Means 762 for examining the processed signal comprises a demodulator 810, a low-pass filter 812 and a comparison means 814 in the form of a comparator. First of all, the processed signal 770 is coherently demodulated in the demodulator 810 with the test signal 720. A resulting demodulated signal 816 is subsequently low-pass filtered in the low-pass filter 812 in order to improve the signal-noise power ratio. The low-pass filtered signal 818 and a set table threshold value signal 820 is detected by the comparison means 814 as input values. The comparison means 814 compares the low-pass filtered signal 818 with respect to maintaining a minimum value determined by the threshold value signal 820. If this value is fallen low of, then the test information of the test signal was not contained in the derived signal 726 the means 762 for examining the processed signal signalizes a fault via a fault indication 780.

For a further protection and for a fault limitation the fault cause "test signal not present" may be tested separately by a control of the existence of the test signal. It is in particular advantageous to perform the control before the demodulator 810 in order to guarantee that with a non-present, open, or faulty test signal 720, like direct current, an arbitrary demodulation result does not indicate a fault-free functioning of the overall system, despite a faulty functioning of the device 752 for an in-operation test of a signal path or the device 702 for generating a sensor signal. For example, it may be tested here, whether the test signal lies at the correct frequency or contains a certain pattern. In the embodiment shown in FIG. 7 the additional feature is shown for a control of the test signal 720 in the form of means 830 for testing the test signal. Means 830 for testing the test signal is connected to the test signal 720 and is implemented in order to provide a second fault indication 832 in the absence of or with a faulty test signal, respectively.

FIG. 8 shows a further embodiment of a sensor means coupled to an evaluation means.

The sensor means comprises a device 702b for generating a sensor signal comprising means 714 for providing a test signal, means 716b for changing the sensor cell output signal and means 718 for outputting the sensor signal. Deviating from the embodiment shown in FIG. 7, in this embodiment the sensor cells 710 are arranged in means 716b for changing the Sensor cell output signal. The sensor cells 710 are thereby arranged according to the embodiment in FIG. 7 in a measurement bridge. Means 716b for changing the sensor cell output signal comprises a reference voltage 730b, 730b' which is modulated with the test signal 720 in modulators 736b in order to obtain a measurement bridge voltage 731b. The part of the test signal 720 contained within the bridge voltage 731b is introduced into the sensor signal 724 inversely proportional to a deflection of the measurement bridge. Means 716b for changing the sensor cell output signal provides the sensor signal 724 in this way, which depends both on the test signal 720 and on a sensor cell output signal (not shown) provided by the sensor cells 710 due to a detected physical magnitude. The sensor signal 724 is in turn connected to means 718 for outputting the sensor signal which is implemented in order to provide the derived signal 726.

The evaluation means 725b shown in FIG. 8 comprises means 760 for processing the sensor signal and means 762 for examining the processed signal. Means 760, 762 correspond to means shown in FIG. 7 and comprise the same reference numerals.

The device 752b additionally comprises means 840 for comparing the ratio. Means 840 for comparing the ratio is connected with the evaluation signal 772 of means 760 for processing the sensor signal and the low-pass filtered signal 818 of means 762 for examining the processed signal and is implemented in order to provide a third fault indication signal 842 in response to the evaluation signal 272 and the low-pass filtered signal 818. If the test information provided by means 114 for providing a test signal is introduced proportional or inversely proportional to the measurement information based on the physical magnitude to be detected into the sensor signal 724, this proportionality may be monitored in means 814 for comparing the ratio. If the proportionality is not fulfilled, then this lack is provided via the third fault indication 842.

In case of a coherent demodulation in the demodulator 818 using the test signal 720, as shown in the figures above, the band-pass filter 802 before the demodulator 810 may be omitted. Thereby, a selectivity of the fault detection path is deteriorated, but this may also be compensated by a lower cut-off frequency of the low-pass filter 812.

If the demodulation in the demodulator 810 is not performed coherently, then the band-pass filtering is required. The demodulation after the band-pass filtering is in the simplest case an amount formation.

Although above preferred embodiments of the present invention were explained in more detail, it is obvious that the present invention is not restricted to those embodiments. In particular, the present invention also applies to different devices and methods, in which the transmission of detected measurement information is guaranteed by a combination of the measurement information to a test stimulus, and a successful or a non-successful transmission is signalized by an evaluation of the also transmitted test stimulus.

Corresponding to the shown embodiments, the invention further comprises a method for generating a sensor signal suitable for an in-operation test of a signal path from a sensor cell to an evaluation location and a method for an in-operation test of a signal path of a sensor cell from a sensor cell to an evaluation location.

Depending on the circumstances, the inventive method for generating a sensor signal and the method for an in-operation test of a signal path may be implemented in hardware or in software. The implementation may be performed on a digital storage medium, in particular a disc, CD, DVD or a ROM, PROM, flash, EEPROM or another non-volatile storage medium having electronically readable control signals which may thus cooperate with a programmable computer system, in particular in the form of an embedded micro-controller or an embedded DSP in particular suitable for integrated systems, so that the corresponding method is performed. In general, the invention therefore also consists in a computer program product 902, 902a, 902b having a program code stored on a machine-readable carrier for performing the inventive method when the computer program product 902, 902a, 902b runs on a computer 900. In other words, the invention may thus be realized as a computer program 902, 902a, 902b with a program code for performing the method when the computer program 902, 902a, 902b runs on a computer 900.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

I claim:

1. A device for generating a sensor signal suitable for an in-operation test of a signal path from a sensor cell to an evaluation location, wherein the sensor cell provides a sensor cell output signal depending on a physical magnitude to be detected, comprising:
    a provider for providing a test signal;
    a changer for changing the sensor cell output signal based on the test signal according to a predetermined change regulation in order to obtain the sensor signal so that the sensor signal depends on the sensor cell output signal and the test signal; and
    an output for outputting the sensor signal or a signal derived from the sensor signal on the signal path.

2. The device for generating the sensor signal of claim 1, wherein the sensor cell is a capacitive or resistive pressure sensor in a measurement bridge arrangement and wherein the change regulation is a switching in or off of capacitors or resistors or a change of an excitation voltage of the measurement bridge arrangement.

3. The device for generating the sensor signal of claim 1, wherein the change regulation is a feeding-in of the test signal in the sensor cell output signal or an adding or upward modulating of the test signal onto the sensor cell output signal.

4. The device for generating the sensor signal according to claim 1, wherein the output for outputting the sensor signal is implemented in order to derive the signal derived from the sensor signal using an FDMA, a TDMA or a CDMA method from the sensor signal.

5. A device for an in-operation test of a signal path from a sensor cell to an evaluation location, wherein the sensor cell provides a sensor cell output signal depending on a physical magnitude to be detected, wherein the Sensor cell output signal is changed based on a test signal according to a predetermined change regulation in order to form a sensor signal, wherein the sensor signal or a signal derived from the sensor signal may be transmitted via a signal path, comprising:
    a processor for processing the sensor signal or the signal derived from the sensor signal considering the predetermined change regulation in order to obtain a processed signal; and
    an examiner for examining the processed signal with regard to a presence or an absence of the test signal in order to provide a fault indication in case of an absence of the test signal.

6. The device for an in-operation test of a signal path according to claim 5, wherein the examiner for examining the processed signal is further coupled to the test signal.

7. The device for an in-operation test of a signal path according to claim 5, wherein due to the change regulation one part of the test signal is in a predetermined ratio to a part of the sensor output signal at the sensor signal and wherein the device for an in-operation test of a signal path further comprises a comparator for comparing the ratio, which is implemented in order to provide a second fault indication in case of an absence of the ratio.

8. The device for an in-operation test of a signal path of claim 7, wherein the ratio is a direct or indirect proportionality.

9. The device for an in-operation test of a signal path according to claim 5, further comprising an examiner for examining the test signal which is connected to the test signal and implemented in order to provide a third fault indication in case of an absence of the test signal.

10. A method for generating a sensor signal suitable for an in-operation test of a signal path from a sensor cell to an evaluation location, wherein the sensor cell provides a sensor cell output signal depending on the physical magnitude to be detected, comprising the steps of:
   (a) providing a test signal;
   (b) changing the sensor cell output signal based on the test signal according to a predetermined change regulation in order to obtain the sensor signal so that the sensor signal depends on the sensor cell output signal and the test signal; and
   (c) outputting the sensor signal or a signal derived from the sensor signal onto the signal path.

11. A method for an in-operation test of a signal path from one sensor cell to an evaluation location, wherein the sensor cell provides a sensor cell output signal depending on a physical magnitude to be detected, wherein the sensor cell output signal is changed based on a test signal according to a predetermined change regulation in order to form a sensor signal, wherein the sensor signal or a signal derived from the sensor signal may be transmitted via a signal path, comprising the steps of:
   (a) processing the sensor signal or the signal derived from the sensor signal considering the predetermined change regulation in order to obtain a processed signal; and
   (b) examining the processed signal with regard to a presence or absence of the test signal in order to provide a fault indication in case of an absence of the test signal.

12. A computer readable medium comprising a computer program having a program code for performing the method for generating a sensor signal suitable for an in-operation test of a signal path from a sensor cell to an evaluation location, wherein the sensor cell provides a sensor cell output signal depending on the physical magnitude to be detected, comprising the steps of:
   (a) providing a test signal;
   (b) changing the sensor cell output signal based on the test signal according to a predetermined change regulation in order to obtain the sensor signal so that the sensor signal depends on the sensor cell output signal and the test signal; and
   (c) outputting the sensor signal or a signal derived from the sensor signal onto the signal path, when the computer program runs on a computer.

13. A computer readable medium comprising a computer program having a program code for performing the method for an in-operation test of a signal path from one sensor cell to an evaluation location, wherein the sensor cell provides a sensor cell output signal depending on a physical magnitude to be detected, wherein the sensor cell output signal is changed based on a test signal according to a predetermined change regulation in order to form a sensor signal, wherein the sensor signal or a signal derived from the sensor signal may be transmitted via a signal path, with the steps of:
   (a) processing the sensor signal or the signal derived from the sensor signal considering the predetermined change regulation in order to obtain a processed signal; and
   (b) examining the processed signal with regard to a presence or absence of the test signal in order to provide a fault indication in case of an absence of the test signal, when the computer program runs on a computer.

* * * * *